United States Patent
Sakaue

(10) Patent No.: US 9,195,536 B2
(45) Date of Patent: Nov. 24, 2015

(54) ERROR CORRECTION DECODER AND ERROR CORRECTION DECODING METHOD

(71) Applicant: Kabushiki Kaisha Toshiba, Minato-ku (JP)

(72) Inventor: Kenji Sakaue, Yokohama (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 64 days.

(21) Appl. No.: 14/087,487

(22) Filed: Nov. 22, 2013

(65) Prior Publication Data
US 2015/0012795 A1 Jan. 8, 2015

Related U.S. Application Data

(60) Provisional application No. 61/843,196, filed on Jul. 5, 2013.

(51) Int. Cl.
*H03M 13/11* (2006.01)
*G06F 11/10* (2006.01)
*H03M 13/00* (2006.01)

(52) U.S. Cl.
CPC ....... *G06F 11/1012* (2013.01); *H03M 13/1111* (2013.01); *H03M 13/1137* (2013.01); *H03M 13/6502* (2013.01)

(58) Field of Classification Search
CPC .................................................... H03M 13/11
USPC .................................. 714/758, 763, 800, 703
See application file for complete search history.

(56) References Cited

U.S. PATENT DOCUMENTS

| 4,326,291 A * | 4/1982 | Marsh et al. ................... 714/800 |
| 4,531,213 A * | 7/1985 | Scheuneman ................. 714/703 |
| 4,573,191 A * | 2/1986 | Kidode et al. ................. 382/106 |
| 7,454,685 B2 | 11/2008 | Kim et al. |
| 7,805,654 B2 | 9/2010 | Seki |

FOREIGN PATENT DOCUMENTS

| JP | 2006-148937 A | 6/2006 |
| JP | 2007-013519 A | 1/2007 |
| JP | 2010-109468 A | 5/2010 |

* cited by examiner

*Primary Examiner* — Fritz Alphonse
(74) *Attorney, Agent, or Firm* — Oblon, McClelland, Maier & Neustadt, L.L.P.

(57) ABSTRACT

According to one embodiment, an error correction decoder includes a storage unit and parity check circuit. The storage unit stores first reliability information corresponding to a hard decision result of each of a plurality of bits which form an ECC (Error Correction Code) frame defined by a parity check matrix, and second reliability information corresponding to a soft decision result of each of the plurality of bits. The storage unit includes a register configured to allow the parity check circuit to steadily read out at least the first reliability information. The parity check circuit executes parity checking of a temporary estimated word based on the first reliability information using the parity check matrix. The parity check circuit executes parity checking once or more before completion of row processing and column processing of the entire parity check matrix by a calculation circuit for each trial of iterative decoding.

16 Claims, 14 Drawing Sheets

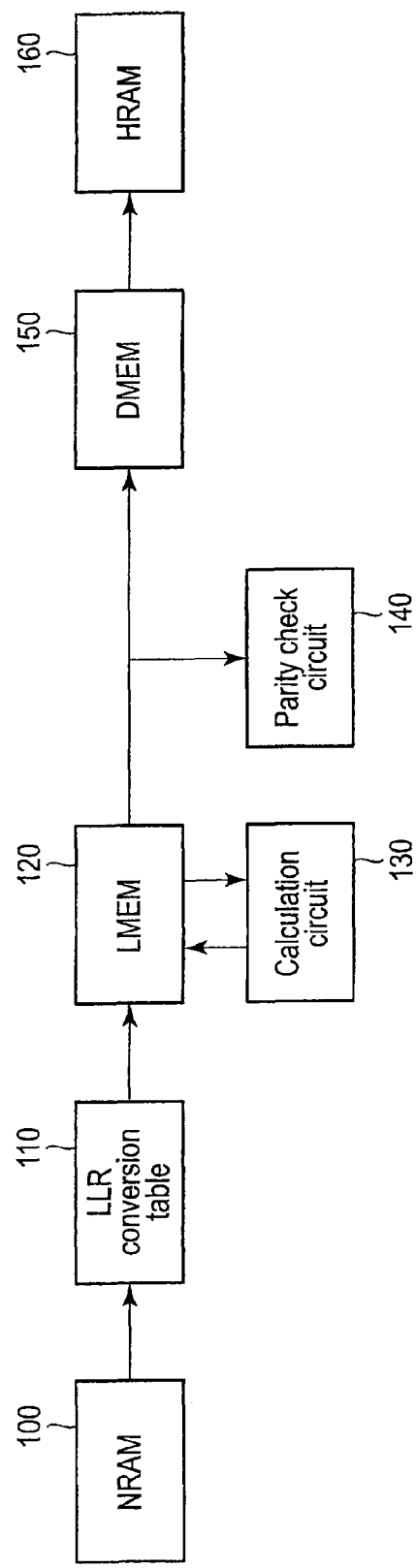
F I G. 1

FIG. 4A

| | A | | | | | B | | | | | C | | | | | D | | | | | E | | | | | F | | | | |
|---|---|---|---|---|---|---|---|---|---|---|---|---|---|---|---|---|---|---|---|---|---|---|---|---|---|---|---|---|---|---|
| | m1 | m2 | m3 | m4 | m5 | m6 | m7 | m8 | m9 | m10 | m11 | m12 | m13 | m14 | m15 | P1 | P2 | P3 | P4 | P5 | P6 | P7 | P8 | P9 | P10 | P11 | P12 | P13 | P14 | P15 |
| 1st row | 1 | | | | | | | | | | | | | | | | | | | | | | | | | | | | | |
| 2nd row | | 1 | | | | | | | | | | | | | | | | | | | | | | | | | | | | |
| 3rd row | | | 1 | | | | | | | | | | | | | | | | | | | | | | | | | | | |
| 4th row | | | | 1 | | | | | | | | | | | | | | | | | | | | | | | | | | |
| 5th row | | | | | 1 | | | | | | | | | | | | | | | | | | | | | | | | | |
| 1st row | | 1 | | | | | | 1 | | | | | 1 | | | | | 1 | | | | | 1 | | | | | 1 | | |
| 2nd row | | | | 1 | | | | | | 1 | | | | | 1 | | 1 | | | | | 1 | | | | | 1 | | | |
| 3rd row | | | | | | 1 | | | | | | 1 | | | | | | | 1 | | | | | | 1 | | | | | 1 |
| 4th row | | | | | | | | 1 | | | | | | 1 | | | | 1 | | | | | 1 | | | | | 1 | | |
| 5th row | 1 | | | | | | | | | 1 | | | | | 1 | | 1 | | | | | 1 | | | | | 1 | | | |
| 1st row | | | 1 | | | | | 1 | | | | | 1 | | | | | 1 | | | | | 1 | | | | | 1 | | |
| 2nd row | | | | | | 1 | | | | | | 1 | | | | | | | 1 | | | | | 1 | | | | | 1 | |
| 3rd row | 1 | | | | | | | | | 1 | | | | | 1 | | | | | 1 | | | | | 1 | | | | | 1 |
| 4th row | | | | 1 | | | | | 1 | | | | | 1 | | | 1 | | | | | 1 | | | | | 1 | | | |
| 5th row | | | | | | | 1 | | | | | | 1 | | | | | 1 | | | | | 1 | | | | | 1 | | |

FIG. 4B

| | A | B | C | D | E | F |
|---|---|---|---|---|---|---|
| Row 1 | 1 | 3 | 2 | 2 | 0 | -1 |
| 2 | 2 | 1 | 3 | 0 | 0 | 0 |
| 3 | 4 | 2 | 1 | 2 | -1 | 0 |

|  | L0 | L1 | L2 | L3 | L4 | L5 | L6 | L7 |  |
|---|---|---|---|---|---|---|---|---|---|
| | 1 | 0 | 0 | 0 | 0 | 0 | 0 | 0 | T0 |
| | 0 | 1 | 0 | 0 | 0 | 0 | 0 | 0 | T1 |
| | 0 | 0 | 1 | 0 | 0 | 0 | 0 | 0 | T2 |
| | 0 | 0 | 0 | 1 | 0 | 0 | 0 | 0 | T3 |
| | 0 | 0 | 0 | 0 | 1 | 0 | 0 | 0 | T4 |
| | 0 | 0 | 0 | 0 | 0 | 1 | 0 | 0 | T5 |
| | 0 | 0 | 0 | 0 | 0 | 0 | 1 | 0 | T6 |
| | 0 | 0 | 0 | 0 | 0 | 0 | 0 | 1 | T7 |

FIG. 5A

|  | L0 | L1 | L2 | L3 | L4 | L5 | L6 | L7 |  |
|---|---|---|---|---|---|---|---|---|---|
| | 0 | 1 | 0 | 0 | 0 | 0 | 0 | 0 | T0 |
| | 0 | 0 | 1 | 0 | 0 | 0 | 0 | 0 | T1 |
| | 0 | 0 | 0 | 1 | 0 | 0 | 0 | 0 | T2 |
| | 0 | 0 | 0 | 0 | 1 | 0 | 0 | 0 | T3 |
| | 0 | 0 | 0 | 0 | 0 | 1 | 0 | 0 | T4 |
| | 0 | 0 | 0 | 0 | 0 | 0 | 1 | 0 | T5 |
| | 0 | 0 | 0 | 0 | 0 | 0 | 0 | 1 | T6 |
| | 1 | 0 | 0 | 0 | 0 | 0 | 0 | 0 | T7 |

FIG. 5B

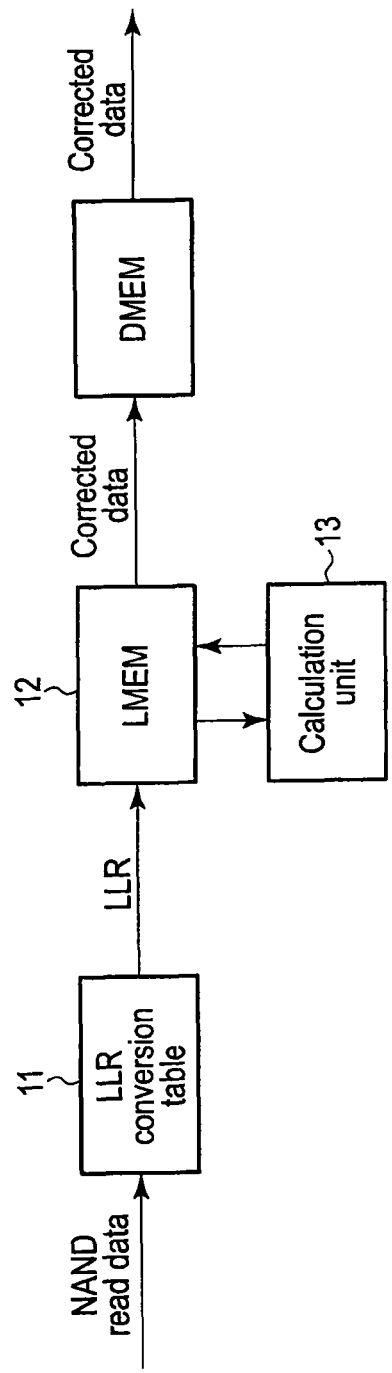
F I G. 7

ERROR CORRECTION DECODER AND ERROR CORRECTION DECODING METHOD

CROSS-REFERENCE TO RELATED APPLICATIONS

This application claims the benefit of U.S. Provisional Application No. 61/843,196, filed Jul. 5, 2013, the entire contents of which are incorporated herein by reference.

FIELD

Embodiments described herein relate generally to an error correction code.

BACKGROUND

Conventionally, for example, error correction codes are used to correct errors of read data from a nonvolatile semiconductor such as a NAND memory. As is known, an LDPC (Low Density Parity Check) code as one type of the error correction code has a high error correction performance. Also, as is known, the LDPC code can improve a decoding performance in proportion to a code length. For example, a code length adopted in a NAND flash memory is about 10 kbit order.

BRIEF DESCRIPTION OF THE DRAWINGS

FIG. 1 is a block diagram showing an example of an error correction decoder according to the first embodiment;

FIG. 4A shows an example of a parity check matrix formed by a plurality of blocks;

FIG. 4B shows an example of numerical values assigned to respective blocks in FIG. 4A;

FIG. 5A is an explanatory view of partial parallel processing of block units;

FIG. 5B is an explanatory view of partial parallel processing of block units;

FIG. 7 is a block diagram showing an example of an error correction decoder of a block-based parallel processing method;

DETAILED DESCRIPTION

Figures 2, 3:
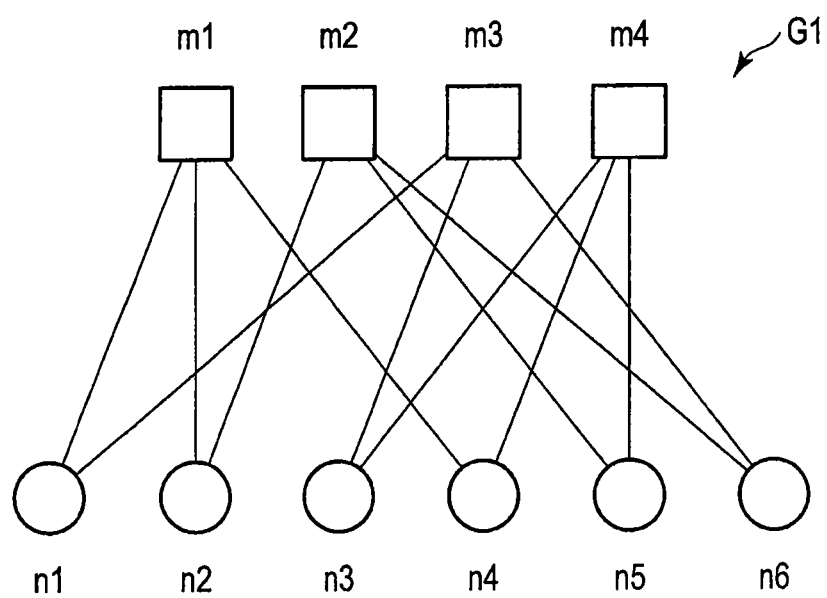
FIG. 2 shows an example of a parity check matrix.
FIG. 3 shows an example of a Tanner graph corresponding to the parity check matrix shown in FIG. 2.

Embodiments will be described hereinafter with reference to the drawings. Note that the same or similar reference numerals denote elements which are the same as or similar to already described elements, and a description thereof will not be repeated.

In general, according to one embodiment, an error correction decoder includes a storage unit, calculation circuit, and parity check circuit. The storage unit stores first reliability information corresponding to a hard decision result of each of a plurality of bits which form an ECC (Error Correction Code) frame defined by a parity check matrix, and second reliability information corresponding to a soft decision result of each of the plurality of bits. The storage unit includes a register configured to allow the parity check circuit to steadily read out at least the first reliability information. The calculation circuit executes row processing and column processing using the first reliability information and second reliability information. The parity check circuit executes parity checking of a temporary estimated word based on the first reliability information using the parity check matrix. The parity check circuit executes parity checking once or more before completion of the entire row processing and the entire column processing for the parity check matrix by the calculation circuit for each trial of iterative decoding.

An LDPC code is defined by the parity check matrix. The error correction decoder typically corrects an error of input data by executing iterative decoding using this parity check matrix.

In general, each row of the parity check matrix is called a check node, and each column of the parity check matrix is called a variable node (or bit node). A row weight means the total number of nonzero elements included in a row of interest, and a column weight means the total number of nonzero elements included in a column of interest. In the parity check matrix which defines a so-called regular LDPC code, the row weight of respective rows is common, and the column weight of respective columns is also common.

FIG. 2 shows an example of a parity check matrix H1. A size of the parity check matrix H1 is 4 rows×6 columns. The four rows of the parity check matrix H1 are respectively called, for example, check nodes m1, . . . , m4. Likewise, the six columns of the parity check matrix H1 are respectively called, for example, variable nodes n1, . . . , n6. A row weight of all the rows of the parity check matrix H1 is 3, and a column weight of all the columns of the parity check matrix H1 is 2. The parity check matrix H1 defines a (6, 2) LDPC code. Note that the (6, 2) LDPC code means an LDPC code having a code length=6 bits and an information length=2 bits.

The parity check matrix can be expressed as a bipartite graph called a Tanner graph. More specifically, variable nodes and check nodes corresponding to nonzero elements in the parity check matrix are connected by edges. More specifically, the total number of edges connected to a variable node is equal to a column weight of a column corresponding to that variable node, and the total number of edges connected to a check node is equal to a row weight of a row corresponding to that check node.

The parity check matrix H1 shown in FIG. 2 can be expressed as a Tanner graph G1 shown in FIG. 3. For example, since an element corresponding to the variable node n5 and check node m2 in the parity check matrix H1 is a nonzero element, the variable node n5 and check node m2 are connected by an edge in the Tanner graph G1.

In iterative decoding (ITR), a temporary estimated word is generated based on reliability information. When a temporary estimated word satisfies parity checking, decoding normally ends; when the temporary estimated word does not satisfy parity checking, the decoding continues. More specifically, in each trial of iterative decoding, reliability information update processing called row processing and column processing is executed for all the check nodes and variable nodes, and a temporary estimated word is generated again based on the updated reliability information. Note that when a temporary estimated word does not satisfy parity checking even after the number of trials of iterative decoding has reached a predetermined upper limit value, decoding is forcibly terminated (abnormally terminated) in general.

As the aforementioned reliability information, reliability information $\alpha$ (for example, called an external value or external information) which propagates from a check node to a variable node via an edge and reliability information $\beta$ (for example, called a prior probability, posterior probability, probability, or LLR (Logarithm Likelihood Ratio)) which propagates from a variable node to a check node via an edge are used. Furthermore, a channel value $\lambda$ depending on read data (or reception signal) corresponding to a variable node is used to calculate the reliability information $\alpha$ and reliability information $\beta$.

Iterative decoding is executed based on, for example, a Sum-Product algorithm, Min-Sum algorithm, or the like. Iterative decoding based on such algorithm can be implemented by parallel processing.

However, complete parallel processing in which all processes are parallelized require a large number of calculation circuits. Especially, since the number of calculation circuits required for the complete parallel processing depends on an LDPC code word length, the complete parallel processing is not practical when the LDPC code word length is large.

On the other hand, according to so-called partial parallel processing, a circuit scale can be reduced. In the partial parallel processing, a parity check matrix is typically formed by a plurality of blocks. Each block is a unit matrix of p (p is an integer not less than 2, and is also called a block size) rows×p columns, a cyclic shift matrix of the unit matrix of p rows×p columns, or a zero matrix of p rows×p columns. The partial parallel processing for such parity check matrix can be implemented by p calculation circuits irrespective of an LDPC code length.

The partial parallel processing adopts, for example, a parity check matrix shown in FIG. 4A. The parity check matrix shown in FIG. 4A is formed by a plurality of blocks of 5 rows×5 columns. A row size of this parity check matrix is 3 blocks (=15 rows), and a column size is 6 blocks (=30 columns). Each block of FIG. 4A is a unit matrix of 5 rows×5 columns, a cyclic shift matrix of the unit matrix of 5 rows×5 columns, or a zero matrix of 5 rows×5 columns. According to the parity check matrix shown in FIG. 4A, the number of calculation circuits required for the partial parallel processing is five.

Each block of FIG. 4A can be expressed by a numerical value, as exemplified in FIG. 4B. In FIG. 4B, "0" is given to a unit matrix, a shift value (right direction) is given to a cyclic shift matrix, and "−1" is given to a zero matrix. Note that the unit matrix can be considered as a cyclic shift matrix of a shift value=0. In general, blocks of p rows×p columns can be expressed by "−1", "0", . . . , "p−1".

A calculation circuit inputs an LMEM variable (or also called LLR) and TMEM variable, and obtains an external value $\alpha$ and prior/posterior probability $\beta$ by calculations based on these variables. The LMEM variable is used to derive the prior/posterior probability $\beta$ for each variable node. The TMEM variable is used to derive the external value $\alpha$ for each check node.

In the partial parallel processing, input variables of the calculation circuit are controlled according to a shift value of a block (except for a zero matrix). For example, as shown in FIGS. 5A, 5B, 6A, 6B, and 6C, a calculation circuit which inputs an arbitrary LMEM variable is fixed irrespective of a shift value, while a calculation circuit which inputs an arbitrary TMEM variable is changed according to a shift value. The calculation circuit which inputs an arbitrary TMEM variable is changed using, for example, a rotater which operates according to a shift value. Note that a calculation circuit which inputs an arbitrary LMEM variable can also be changed according to a shift value.

Figure 6A:
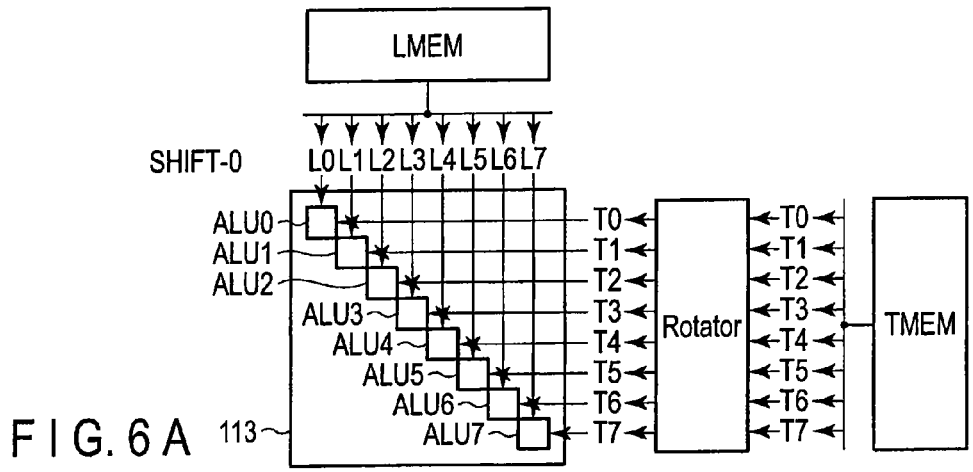
FIG. 6A is an explanatory view of partial parallel processing of block units.
Figure 6B:
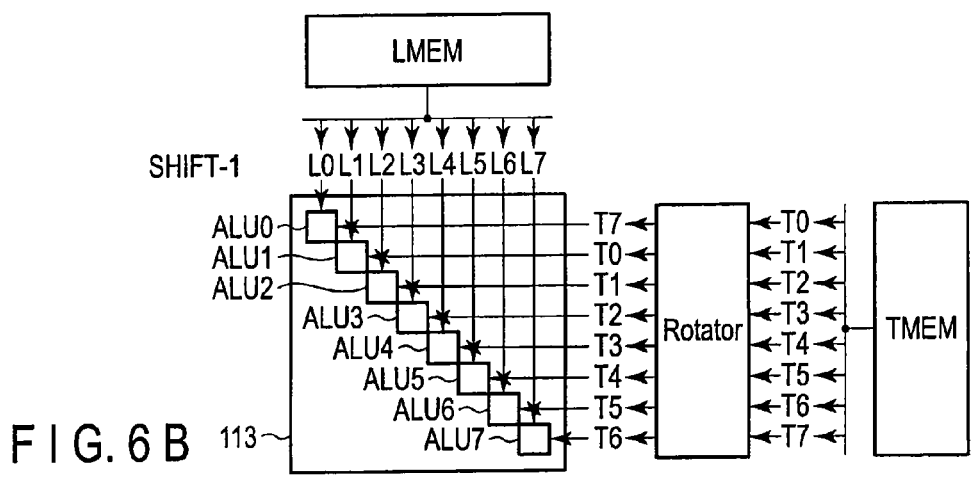
FIG. 6B is an explanatory view of partial parallel processing of block units.
Figure 6C:
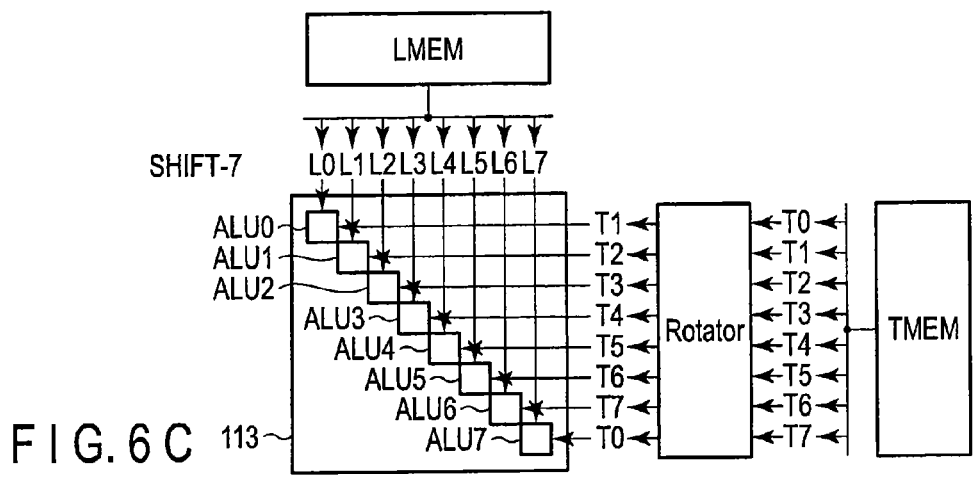
FIG. 6C is an explanatory view of partial parallel processing of block units.

A variable node storage circuit (LMEM) shown in FIGS. 6A, 6B, and 6C stores LMEM variables. The LMEM variables are managed by column addresses. A check node storage unit (TMEM) shown in FIGS. 6A, 6B, and 6C store TMEM variables. The TMEM variables are managed by row addresses. A rotater shown in FIGS. 6A, 6B, and 6C inputs eight TMEM variables T0, . . . , T7 from the TMEM, and rotates these variables according to a shift value of a block to be processed. Each of calculation circuits ALU0, . . . , ALU7 shown in FIGS. 6A, 6B, and 6C inputs a corresponding LMEM variable from the LMEM, and inputs a corresponding rotated TMEM variable from the rotater.

As exemplified in FIGS. 5A and 6A, when a shift value=0, TMEM variables undergo rotate processing of a rotate value=0. Note that the rotate processing of the rotate value=0 is equivalent to non-execution of the rotate processing. Therefore, the ALU0 inputs an LMEM variable L0 of a column address=0 and a TMEM variable T0 of a row address=0, and the ALU7 inputs an LMEM variable L7 of a column address=7 and a TMEM variable T7 of a row address=7.

As exemplified in FIGS. 5B and 6B, when a shift value=1, TMEM variables undergo rotate processing of a rotate value=1. Note that the rotate processing of the rotate value=1 is equivalent to cyclic shifting of row addresses of the TMEM variables by 1 in a decrease direction. Therefore, the ALU0 inputs an LMEM variable L0 of a column address=0 and a TMEM variable T7 of a row address=7, and the ALU7 inputs an LMEM variable L7 of a column address=7 and a TMEM variable T6 of a row address=6.

As exemplified in FIG. 6C, when a shift value=7, TMEM variables undergo rotate processing of a rotate value=7. Note that the rotate processing of the rotate value=7 is equivalent to cyclic shifting of row addresses of the TMEM variables by 1 in a decrease direction or application of the rotate processing of the rotate value=1 seven times. Therefore, the ALU0 inputs an LMEM variable L0 of a column address=0 and a TMEM variable T1 of a row address=1, and the ALU7 inputs an LMEM variable L7 of a column address=7 and a TMEM variable T0 of a row address=0.

Note that in general, the rotater is required to execute rotate processing of a rotate value=p−1 at maximum. When the number of quantization bits of a TMEM variable is "u", an input/output bit width of the rotater is required to be designed to be not less than u×p bits.

The partial parallel processing is generally implemented according to a block-based parallel processing method. In the block-based parallel processing method, memory accesses using continuous addresses are made to LLR data stored in the LMEM. The block-based parallel processing method requires a complicated arithmetic algorithm and a plurality of large-scale logic (large-scale wiring area) rotaters. Especially, the plurality of rotaters disturb improvement of a parallel degree, that is, that of a processing speed.

FIG. 7 shows an example of an error correction decoder of the block-based parallel processing method. The error correction decoder shown in FIG. 7 includes an LLR conversion table 11, LMEM 12, calculation unit 13, and DMEM.

The LLR conversion table 11 inputs ECC (Error Correction Code) frame data corresponding to LDPC code data read out from a NAND flash memory (not shown). More specifically, the LLR conversion table 11 sequentially inputs read data of a block size equivalent amount in turn from the first data of the ECC frame data. The LLR conversion table 11 converts read data into LLR data, thereby sequentially generating LLR data of the block size equivalent amount. In the LMEM 12, the LLR data of the block size equivalent amount from the LLR conversion table 11 are sequentially written.

The calculation unit 13 reads out LLR data of the block size equivalent amount from the LMEM 12, makes calculations using these data, and writes back calculation results in the LMEM 12. The calculation unit 13 includes calculation circuits, the number of which is equal to the block size. The calculation unit 13 includes a rotater so as to make calculations according to a shift value of a block. This rotater requires an input/output width of at least the number of quantization bits of variables to be handled×the block size. For example, when the block size is 128 rows×128 columns or 256 rows×256 columns, the circuit scale and wiring scale of the rotater are huge.

After calculations of the calculation unit 13, a temporary estimated word is generated based on reliability information. If the temporary estimated word satisfies parity checking, correction data based on the LLR data stored in the LMEM 12 is written in the DMEM.

Figure 8:
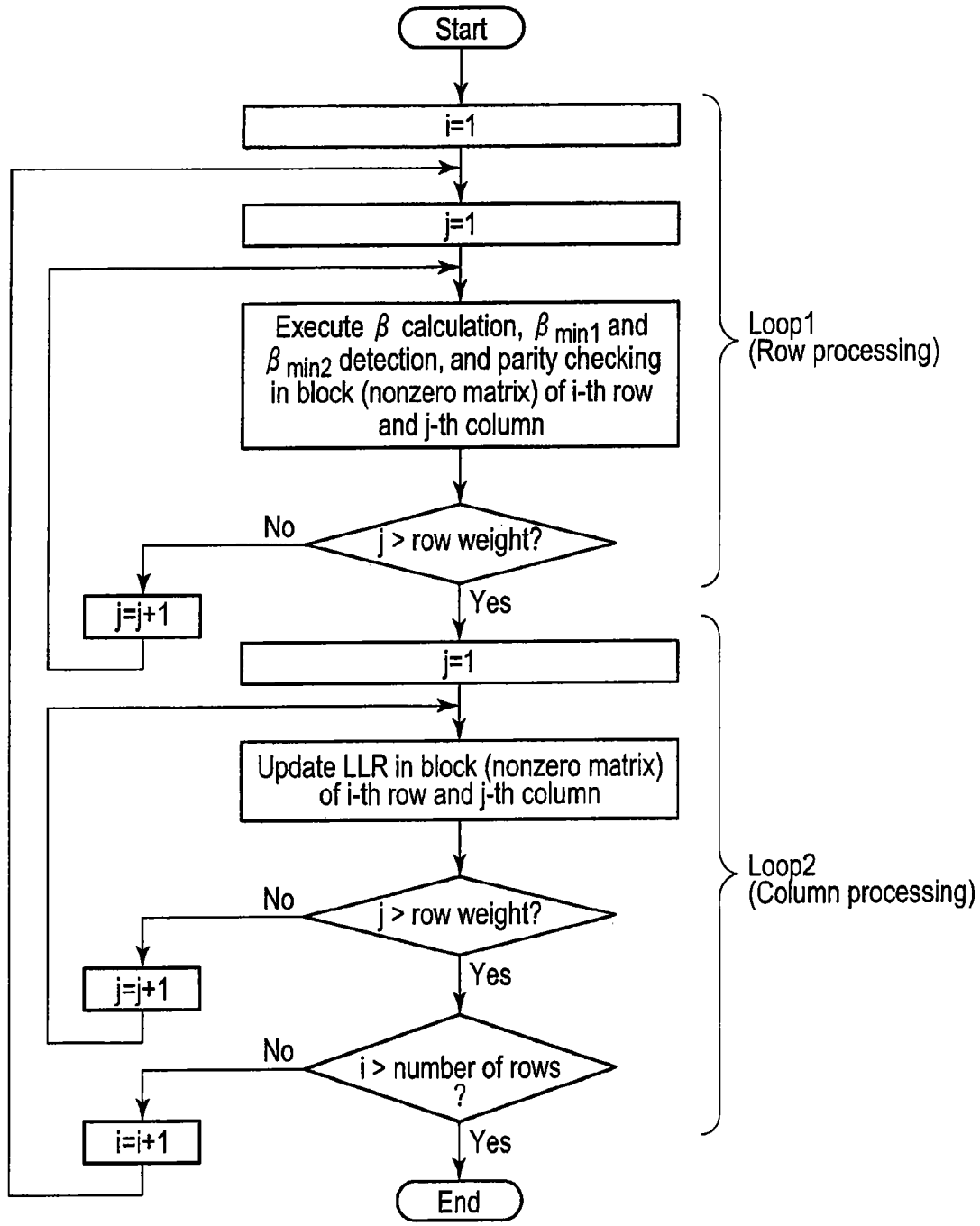
FIG. 8 is a flowchart showing an example of error correction decoding processing of the block-based parallel processing method.

The error correction decoder of the block-based parallel processing method executes row processing and column processing via independent loops, as exemplified in FIG. 8. Note that in the description related to FIG. 8, the number of rows and the number of columns are referred to in a block unit.

In Loop1 (row processing), various calculations are parallelly made for variable nodes and check nodes which belong to a block to be processed. In Loop1, the block to be processed moves in turn from the i-th row and first column in a column direction. For example, data $\beta$ for each variable node which belongs to the block to be processed is calculated by subtracting, from LLR data corresponding to that variable node, data $\alpha$ added to the LLR data in column processing of the previous iterative decoding of that block. Data $\beta$ for each variable node is temporarily written back to the LMEM. Furthermore, for each check node which belongs to the block to be processed, a smallest value $\beta_{min1}$ and second smallest value $\beta_{min2}$ are detected with reference to absolute values of data $\beta$. Data $\beta_{min1}$ and $\beta_{min2}$ for each check node are temporarily stored in the TMEM. Note that data $\beta_{min1}$ and $\beta_{min2}$ for each check node stored in the TMEM may be updated as the processing of blocks which belong to the i-th row processes. Then, data $\beta_{min1}$ and $\beta_{min2}$ for each check node, which are stored in the TMEM at the end timing of processing of all blocks which belong to the i-th row, are used in the next column processing.

In Loop2 (column processing), LLR data for respective variable nodes which belong to a block to be processed are parallelly updated. In Loop2 as well, the block to be processed moves in turn from the i-th row and first column. More specifically, data $\beta$ for each variable node, which is written back to the LMEM in row processing of the previous iterative decoding, is read out, and data $\beta_{min1}$ and $\beta_{min2}$ are read out from the TMEM. Data $\alpha$ of a corresponding check node is added to data $\beta$ for each variable node, and a calculation result is written back to the LMEM as updated LLR data of that variable mode.

Figure 9:
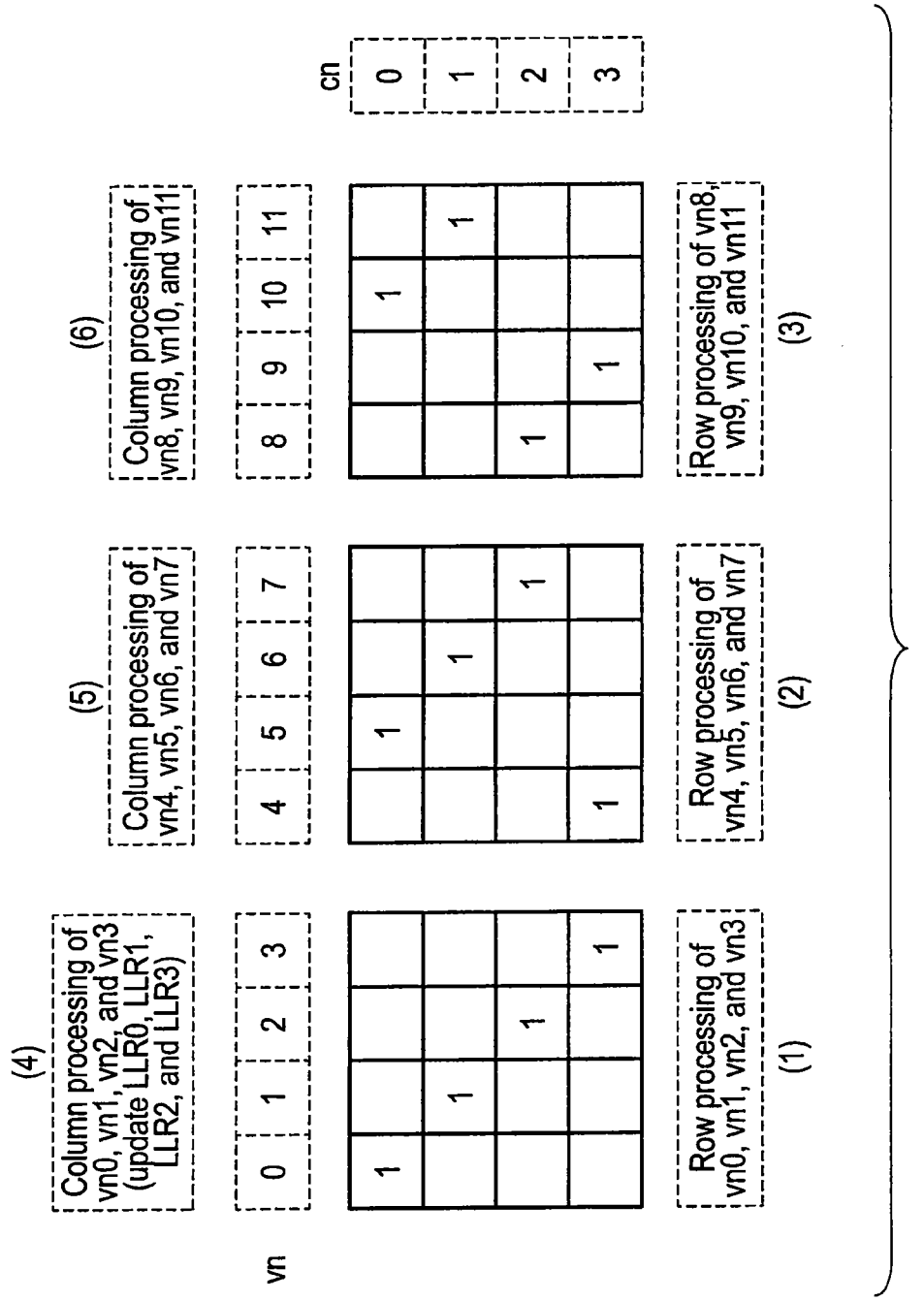
FIG. 9 shows execution orders of row processing and column processing in the block-based parallel processing method.

As described above, since the block-based parallel processing method cannot simultaneously execute the row processing and column processing, processing efficiency is poor. More specifically, according to the block-based parallel processing method, the row processing and column processing progress, as exemplified in FIG. 9. Note that in the example shown in FIG. 9, a block size is 4 rows×4 columns, a row size of a parity check matrix is 1 block (=4 rows), and a column size of the parity check matrix is 3 blocks (=12 columns).

Also, according to the block-based parallel processing method, in each of the row processing and column processing, read/write accesses to the LMEM 12 are made. That is, for each trial of iterative decoding, two read/write accesses are made to the LMEM 12. Therefore, power consumption is large. Especially, when the LMEM 12 is implemented by an SRAM, not only write accesses but also read accesses consume electric power. In short, the block-based parallel processing method requires a large circuit scale and power consumption, resulting in poor cost performance.

Note that if a buffer for temporarily storing data $\beta$ is added in addition to the LMEM 12, read/write accesses to the LMEM 12 itself can be suppressed to once. However, since a storage capacity required for this buffer is equal to that of the LMEM 12, addition of such buffer results in an increase in circuit scale. Furthermore, although read/write accesses to the LMEM 12 itself can be suppressed to once, since read/write accesses to the buffer are newly required, power consumption of the overall error correction decoder cannot be reduced.

The reason why the block-based parallel processing method cannot simultaneously execute the row processing and column processing is that detection of data $\beta_{min1}$ and $\beta_{min2}$ for each check node and updating of LLR data for each variable node cannot be simultaneously executed.

Figure 10:
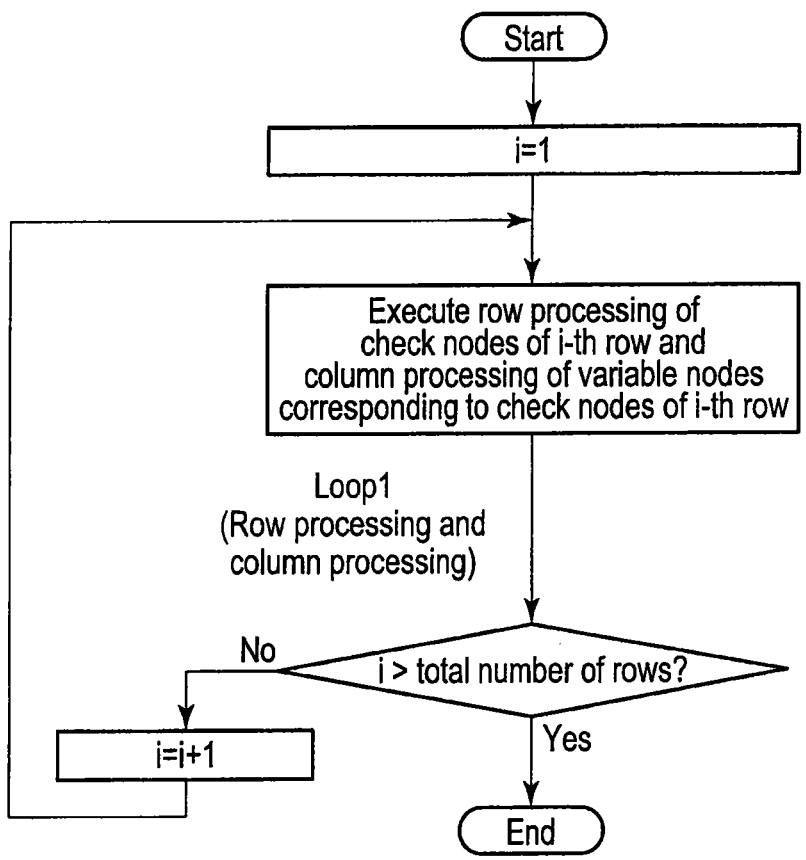
FIG. 10 is a flowchart showing an example of error correction decoding processing of a check node-based parallel processing method.

A check node-based parallel processing method to be described below is recommended compared to the block-based parallel processing method in terms of at least cost performance (especially, a circuit scale and power consumption) and correction performance for hard errors. To recapitulate, the check node-based parallel processing method executes row processing and column processing for each row of a parity check matrix through a single loop, as exemplified in FIGS. 10 and 11.

Figure 11:
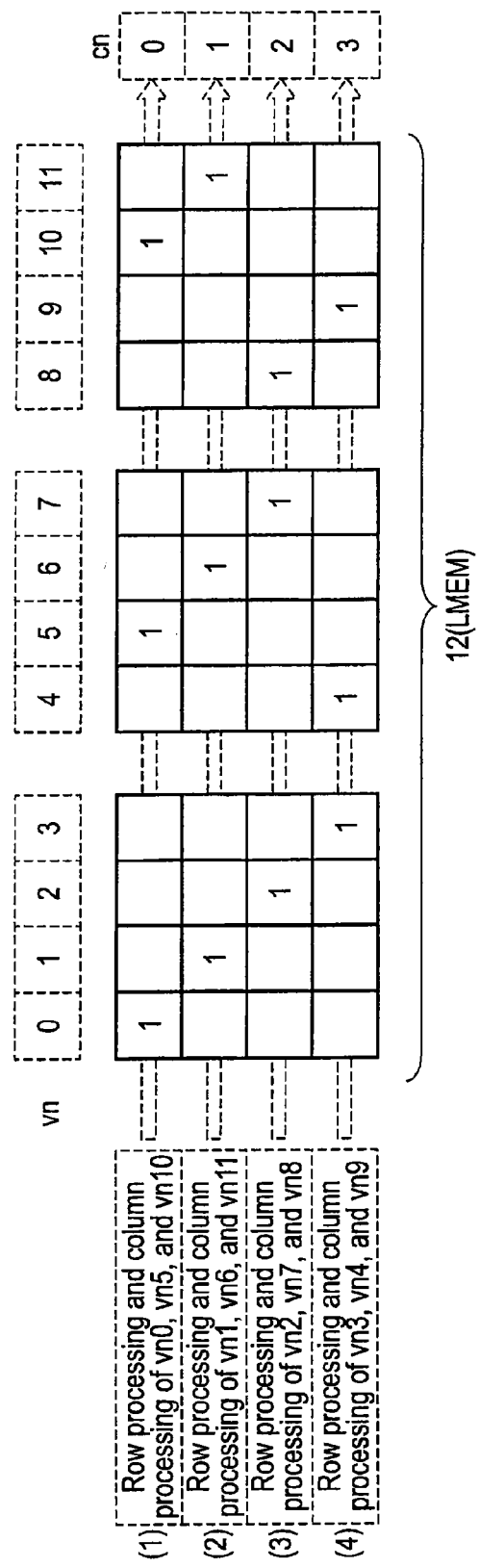
FIG. 11 shows execution orders of row processing and column processing in the check node-based parallel processing method.

As shown in FIG. 11, according to the check node-based parallel processing method, LLR data of variable nodes corresponding to a check node to be processed (in other words, variable nodes connected to the check node to be processed by edges in a Tanner graph) are read out. That is, addresses of LLR data to be read out are not always continuous. Note that according to the aforementioned block-based parallel processing method, LLR data are read out using continuous addresses.

In order to attain such LLR read accesses, the LMEM is designed according to the number of blocks arranged in the column direction of a parity check matrix. For example, the LMEM may be designed to include LMEM modules as many as the number of blocks, or to include ports as many as the number of blocks. According to the example shown in FIG. 11, the number of blocks arranged in the column direction of the parity check matrix is 3. Therefore, the LMEM may be designed to include three LMEM modules or to include three ports. According to such design, arbitrary three independent addresses can be designated for the LMEM, and LLR data of three variable nodes are read out according to the designated addresses.

Figure 12:
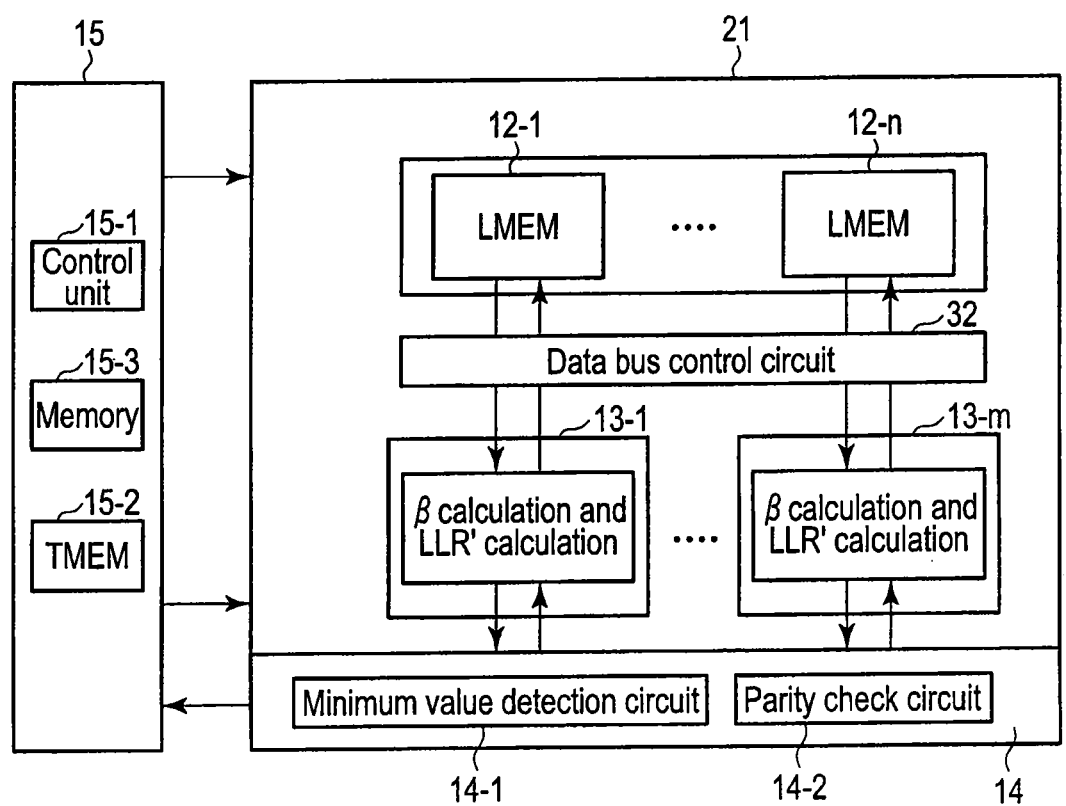
FIG. 12 is a block diagram showing an example of an error correction decoder of the check node-based parallel processing method.

FIG. 12 shows an example of an error correction decoder 21 of the check node-based parallel processing method. The error correction decoder shown in FIG. 12 includes an LMEM, m calculation circuits 13-1, ..., 13-m, a logic circuit 14 in a row direction, a logic circuit 15 in a column direction, and a data bus control circuit 32. Note that a parallel degree (the number of check nodes which can be simultaneously processed in one stage) of the error correction decoder 21 shown in FIG. 12 is 1. However, by extending the number of function units to twice, three times, ..., the parallel degree can be increased to 2, 3, ....

The LMEM shown in FIG. 12 is formed by n LMEM modules 12-1, ..., 12-n. n is equal to the number of blocks arranged in the column direction of a parity check matrix. The LMEM modules 12-1, ..., 12-n may be implemented by, for example, registers. A storage capacity of each of the LMEM modules 12-1, ..., 12-n is a block size×the number of quantization bits (for example, 6 bits) of LLR data or more.

The logic circuit 15 includes a control unit 15-1, TMEM 15-2, and memory 15-3. The control unit 15-1 controls the operation of the error correction decoder 21. The control unit 15-1 is implemented by, for example, a sequencer. The control unit 15-1 designates addresses which are the same in the number as row weights (that is, m addresses) according to shift values of a plurality of blocks to which check nodes to be processed belong. As a result, LLR data are read out one by one from m LMEM modules of the LMEM modules 12-1, ..., 12-n.

The TMEM 15-2 stores various intermediate value data. Note that the intermediate value data includes data $\beta_{min1}$ and $\beta_{min2}$ for each check node (they decide an absolute value of data $\alpha$), a sign of data $\alpha$ for each variable node (sign information of data $\alpha$ added to data $\beta$ for each variable node corresponding to each check node), INDEX data (identification information of a variable node which gives data $\beta_{min1}$ for each check node), a parity check result for each check node, and the like. The memory 15-3 stores, for example, information of the parity check matrix, LLR conversion table, and the like.

The logic circuit 14 includes a smallest value detection circuit 14-1 and parity check circuit 14-2. The smallest value detection circuit 14-1 detects a smallest value smallest value $\beta_{min1}$ and second smallest value $\beta_{min2}$ for a check node to be processed with reference to absolute values of data $\beta$ calculated by the calculation circuits 13-1, ..., 13-m upon execution of row processing of the check node to be processed, and further detects INDEX data as identification information of a variable node which gives that data $\beta_{min1}$. The parity check circuit 14-2 executes parity checking of a check node to be processed using data $\beta$ calculated by the calculation circuits 13-1, ..., 13-m upon execution of row processing of the check node to be processed. This parity check result is used to decide the sign of data $\alpha$ for each variable node.

"m" as the total number of the calculation circuits 13-1, ..., 13-m is equal to the row weight of the parity check matrix. Note that in a parity matrix formed by a plurality of blocks, a row weight is equal to the total number of blocks corresponding to nonzero matrices arranged in the column direction. That is, each of the calculation circuit 13-1, ..., 13-m reads out LLR data of a variable node corresponding to a check node to be processed of those which belong to a block corresponding to a corresponding nonzero matrix via the data bus control circuit 32. The data bus control circuit 32 dynamically assigns LLR data of an appropriate variable node to each of the calculation circuits 13-1, ..., 13-m according to a check node to be processed. This dynamic assignment makes it possible to reduce the circuit scale of the calculation circuits 13-1, ... 13-m.

The calculation circuits 13-1, ..., 13-m calculate data $\beta$ of m variable nodes corresponding to a check node to be processed based on LLR data read out from the LMEM modules 12-1, ..., 12-n, data $\alpha$ which is read out from the TMEM 15-2 and was used in the previous iterative decoding, the sign of data $\alpha$ for each variable node used in the previous iterative decoding, and INDEX data used in the previous iterative decoding, upon execution of row processing of the check node to be processed.

Furthermore, the calculation circuits 13-1, ..., 13-m update LLR data based on data $\beta$ calculated in the preceding row processing, and data $\beta_{min1}$ and $\beta_{min2}$, INDEX data, and the parity check result of a check node to be processed derived by the smallest value detection circuit 14-1 and parity check circuit 14-2 in the preceding row processing upon execution of column processing of m variable nodes corresponding to the check node to be processed. In the following description, updated LLR data will be referred to as LLR' data for the sake of convenience. The LLR' data are written back to the LMEM modules 12-1, ..., 12-n.

Figure 13:
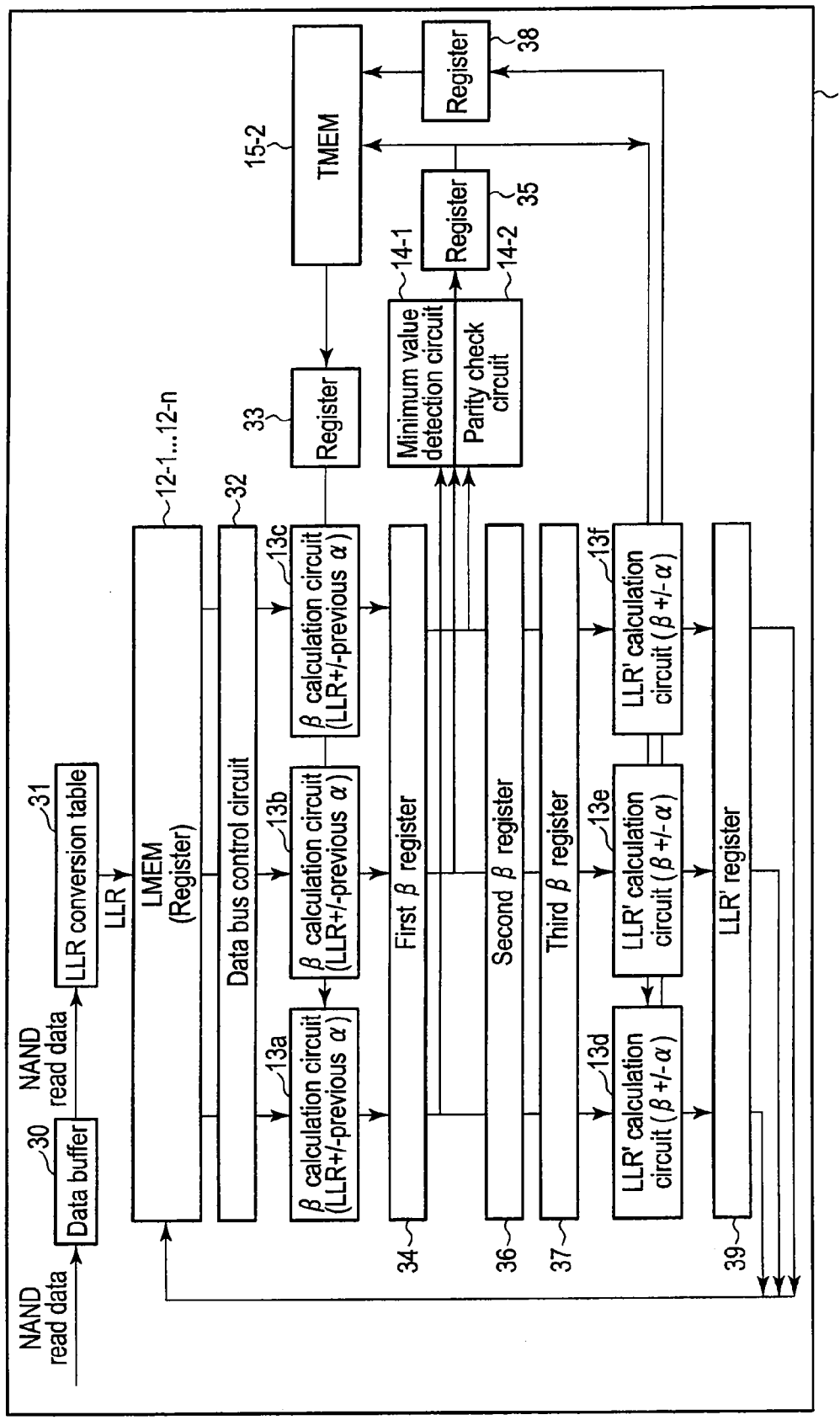
FIG. 13 is a block diagram showing a practical embodiment of the error correction decoder of the check node-based parallel processing method.

FIG. 13 shows a practical implementation example of the error correction decoder 21 of the check node-based parallel processing method. The error correction decoder 21 shown in FIG. 13 is designed to be able to execute pipeline processing of five stages, as exemplified in FIG. 14. An execution timing of each stage is controlled by a clock signal (not shown).

The error correction decoder 21 shown in FIG. 13 includes a data buffer 30, an LLR conversion table 31, the LMEM modules 12-1, ..., 12-n, the data bus control circuit 32, $\beta$ calculation circuits 13a, 13b, and 13c, a first $\beta$ register 34, the smallest value detection circuit 14-1, the parity check circuit 14-2, a register 35, the TMEM 15-2, a register 33, a second $\beta$ register 36, a third $\beta$ register 37, LLR' calculation circuits 13d, 13e, and 13f, a register 38, and an LLR' register 39.

Note that the $\beta$ calculation circuits and LLR' calculation circuits shown in FIG. 13 correspond to those obtained by functionally dividing the calculation circuits shown in FIG. 12, as will be described later. Therefore, the $\beta$ calculation circuits and the LLR' calculation circuits to be described later are arranged to be the same in the number as the row weight of the parity check matrix. In other words, in the example of FIG. 13, the row weight=3.

The data buffer 30 temporarily stores NAND read data from a NAND flash memory (not shown). The NAND read data is appended with a parity bit in, for example, an ECC frame unit by an error correction encoder (not shown). The data buffer 30 outputs the stored NAND read data to the LLR conversion table 31 as needed.

The LLR conversion table 31 converts the NAND read data from the data buffer 30 into LLR data. The LLR data converted by the LLR conversion table 31 are written in the LMEM modules 12-1, ..., 12-n.

The LMEM modules 12-1, ..., 12-n can be connected to first input terminals of the $\beta$ calculation circuits 13a, 13b, and 13c via the data bus control circuit 32. The data bus control circuit 32 connects appropriate LMEM modules to the first input terminals of the β calculation circuits 13a, 13b, and 13c by the aforementioned dynamic assignment. As a result, the β calculation circuits 13a, 13b, and 13c can acquire LLR data of three variable nodes corresponding to a check node to be processed.

The TMEM 15-2 stores various intermediate values. For example, the TMEM 15-2 stores data $\beta_{min1}$ and $\beta_{min2}$ for each check node (they decide an absolute value of data α), a sign of data α for each variable node, INDEX data, and a parity check result for each check node. Second input terminals of the β calculation circuits 13a, 13b, and 13c are connected to the TMEM 15-2 via the register 33. As a result, the β calculation circuits 13a, 13b, and 13c can acquire various intermediate values from the TMEM 15-2.

The β calculation circuits 13a, 13b, and 13c calculate data β of three variable nodes corresponding to a check node to be processed based on LLR data input via the first input terminals and various intermediate values input via the second input terminals. Output terminals of the β calculation circuits 13a, 13b, and 13c are connected to the first β register 34.

The first β register 34 stores data β from the β calculation circuits 13a, 13b, and 13c. Output terminals of the first β register 34 are connected to input terminals of the smallest value detection circuit 14-1 and parity check circuit 14-2. As a result, the smallest value detection circuit 14-1 and parity check circuit 14-2 can acquire data β from the first β register 34.

The smallest value detection circuit 14-1 detects a smallest value $\beta_{min1}$ and second smallest value $\beta_{min2}$ for a check node to be processed with reference to absolute values of data β of the check node to be processed stored in the first β register 34, and further obtains INDEX data. The smallest value detection circuit 14-1 outputs data $\beta_{min1}$, data $\beta_{min2}$, and INDEX data to the register 35.

The parity check circuit 14-2 executes parity checking of a check node to be processed using data β of the check node to be processed stored in the first β register 34. More specifically, the parity check circuit 14-2 makes EX-OR calculations using all β sign bits of the check node to be processed. If a calculation result is 0, a parity check result is OK; if a calculation result is 1, a parity check result is NG. The parity check circuit 14-2 outputs the parity check result of the check node to be processed to the register 35.

Note that the smallest value detection circuit 14-1 and parity check circuit 14-2 are connected in parallel in FIG. 13, but they may be connected in series. However, when these circuits are connected in series, the number of pipeline stages is inevitably increased. Therefore, processes of the smallest value detection circuit 14-1 and parity check circuit 14-2 are preferably designed to be completed within short clock cycles (for example, one to two clock cycles).

The two β registers 36 and 37 are connected between output terminals of the first β register 34 and first input terminals of the LLR' calculation circuits 13d, 13e, and 13f. Data β stored in the first β register 34 are passed in turn from the first β register 34 to the second β register 36 and then from the second β register 36 to the third β register 37. Then, the LLR' calculation circuits 13d, 13e, and 13f can acquire data β via the first input terminals. The number of β registers connected between the output terminals of the first β register 34 and the first input terminals of the LLR' calculation circuits 13d, 13e, and 13f depends on the number of pipeline stages and the number of clock cycles required for processing of each stage. In the example shown in FIGS. 13 and 14, the number of pipeline stages is 5, and the number of clock cycles required for processing of each stage is 1.

The register 35 temporarily stores various intermediate values from the smallest value detection circuit 14-1 and parity check circuit 14-2, and then outputs them to the TMEM 15-2 and LLR' calculation circuits 13d, 13e, and 13f. The LLR' calculation circuits 13d, 13e, and 13f can acquire various intermediate values from the register 35 via second input terminals.

The LLR' calculation circuits 13d, 13e, and 13f calculate LLR' data of three variable nodes corresponding to a check node to be processed based on data β input via the first input terminals and various intermediate values input via the second input terminals. First output terminals of the LLR' calculation circuits 13d, 13e, and 13f are connected to the LLR' register 39. Also, second output terminals of the LLR' calculation circuits 13d, 13e, and 13f are connected to the register 38.

The register 38 temporarily stores a sign of data α for each variable node from the LLR' calculation circuits 13d, 13e, and 13f. Various intermediate values stored in the register 38 are written in the TMEM 15-2. The LLR' register 39 temporarily stores LLR' data from the LLR' calculation circuits 13d, 13e, and 13f. LLR' data stored in the LLR' register 39 are written back to the LMEM modules 12-1, . . . , 12-n.

Figure 14:
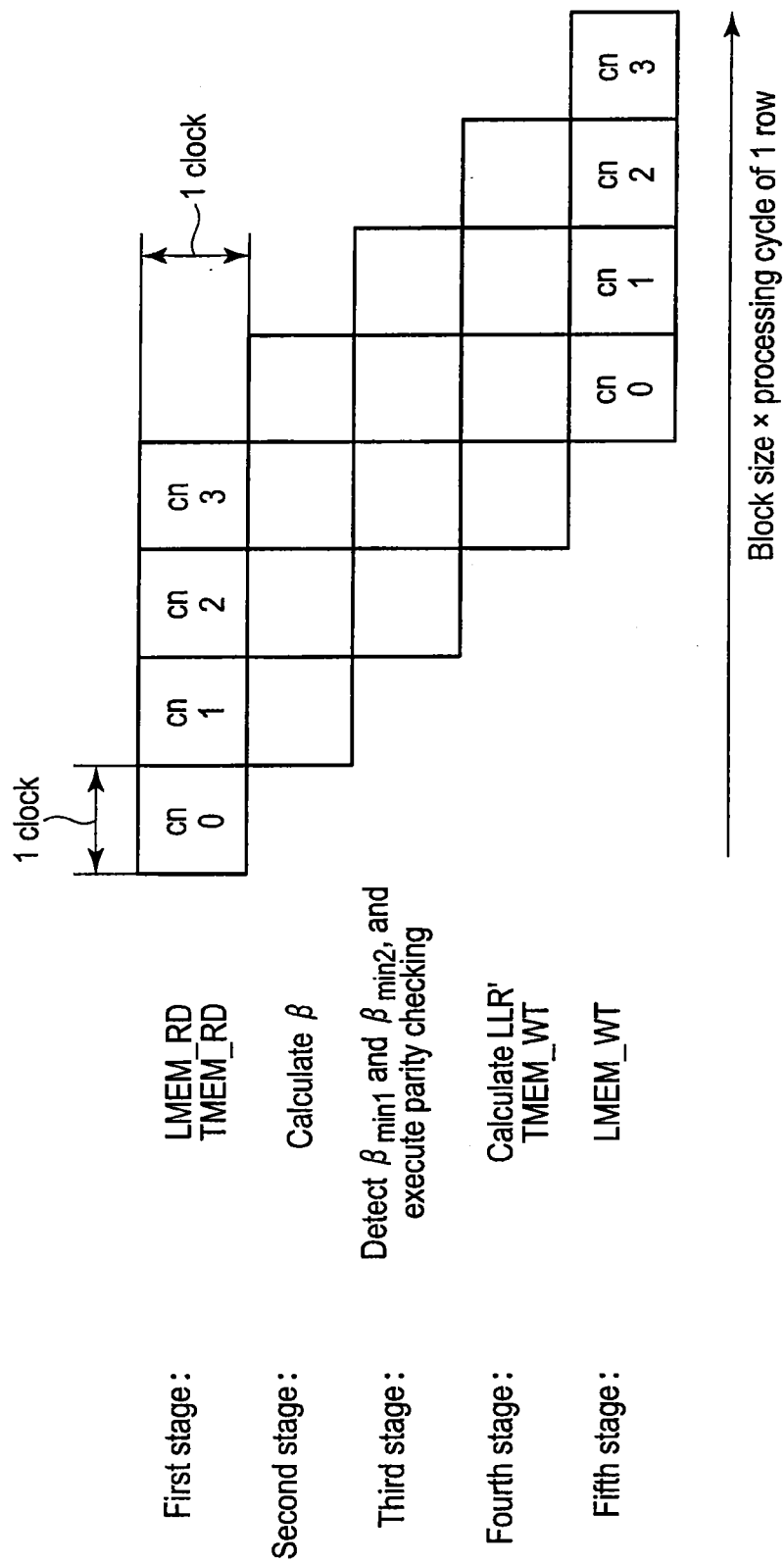
FIG. 14 is a view for explaining pipeline processing executed by the error correction decoder shown in FIG. 13.

A first stage shown in FIG. 14 includes read accesses of LLR data from the LMEM modules 12-1, . . . , 12-n and read accesses of various intermediate values from the TMEM 15-2. More specifically, LLR data of three variable nodes corresponding to a check node to be processed are read out from the LMEM modules 12-1, . . . , 12-n. Also, data $\beta_{min1}$ and $\beta_{min2}$ used in the previous iterative decoding, the sign of data α for each variable node used in the previous iterative decoding, INDEX data used in the previous iterative decoding are read out from the TMEM 15-2.

A second stage shown in FIG. 14 includes β calculations by the β calculation circuits 13a, 13b, and 13c. More specifically, the β calculation circuits 13a, 13b, and 13c calculate data β based on the LLR data and various intermediate values read out in the first stage. For example, data β may be calculated by subtracting data α used in the previous iterative decoding from LLR data. The absolute value of data $\beta_{min2}$ is used as that of data α for the same variable node as INDEX used in the previous iterative decoding. On the other hand, the absolute value of data $\beta_{min1}$ is used as that of data α for a variable node different from INDEX used in the previous iterative decoding. The calculated values of data β are temporarily stored in the first β register 34.

A third stage shown in FIG. 14 includes detection of values $\beta_{min1}$ and $\beta_{min2}$ by the smallest value detection circuit 14-1 and parity checking of a check node to be processed by the parity check circuit 14-2. More specifically, the smallest value detection circuit 14-1 detects values $\beta_{min1}$ and $\beta_{min2}$ with reference to the absolute values from β calculated in the second stage, and further detects INDEX data as identification information of a variable node that gives the value $\beta_{min1}$. The parity check circuit 14-2 executes parity checking of a check node to be processed using β calculated in the second stage. The detected value $\beta_{min1}$, value $\beta_{min2}$, and INDEX data, and the parity check result of the check node to be processed are temporarily stored in the register 35. Note that the values β stored in the first β register 34 are sequentially passed in turn from the first β register 34 to the second β register 36 and then from the second β register 36 to the third β register 37 during the third stage.

A fourth stage shown in FIG. 14 includes LLR' calculations by the LLR' calculation circuits 13d, 13e, and 13f. More specifically, the LLR' calculation circuits 13d, 13e, and 13f calculate LLR' data based on data β calculated in the second stage and various intermediate values obtained in the third stage. For example, LLR' data may be calculated by adding data α to data β.

Note that the absolute value of data α can be decided based on data $β_{min1}$, data $β_{min2}$, and INDEX data. That is, the absolute value of data $β_{min2}$ is used as that of data α for the same variable node as INDEX data. On the other hand, the absolute value of data $β_{min1}$ is used as that of data α for a variable node different from INDEX.

The sign of data α can be decided based on the sign of data β and the parity check result of the check node to be processed. For example, when the sign of data β is 0 (that is, positive), and the parity check result is OK, the sign of data α is also decided as 0. That is, LLR' is a sum (>0) of data β (>0) and data α (>0). On the other hand, when the sign of data β is 0 but the parity check result is NG, the sign of data α is decided as 1 (that is, negative). That is, LLR' is a sum of data β (>0) and data α (<0). Also, when the sign of data β is 1, and the parity check result is OK, the sign of data α is decided as 1. That is, LLR' is a sum (>0) of data β (<0) and data α (<0). On the other hand, when the sign of data β is 1 but the parity check result is NG, the sign of the data α is decided as 0. That is, LLR' is a sum of data β (<0) and data α (>0).

Various intermediate values (that is, data $β_{min1}$, data $β_{min2}$, INDEX data, and the sign of data α for each variable node) used in LLR' calculations in the fourth stage are written in the TMEM 15-2 for the next iterative decoding via the registers 35 and 38.

A fifth stage shown in FIG. 14 includes write-back accesses of LLR' data to the LMEM modules 12-1, . . . , 12-n. More specifically, the LLR' data calculated in the fourth stage are written back to the LMEM modules 12-1, . . . , 12-n via the LLR' register 39.

According to the error correction decoder shown in FIG. 13, the first β register 34, second β register 36, and third β register 37 are prepared as buffers used to temporarily store calculated values of data β. Each of these β registers is required to store data β of variable nodes corresponding to a check node to be processed, but need not store data β of other variable nodes. Hence, only a storage capacity of the row weight of the parity check matrix×the number of quantization bits of data β is required. Therefore, the circumstance is different from the case in which buffers used to temporarily store data β are assured in the aforementioned block-based parallel processing method. That is, according to the check node-based parallel processing method, an increase in circuit scale can be suppressed, and a power consumption reduction effect due to suppression of the number of read/write access times to the LMEM to once can be obtained.

As described above, the check node-based parallel processing method is preferable in terms of the circuit scale, power consumption, processing speed, and the like compared to the block-based parallel processing method. Embodiments to be described below are applicable not only to the check node-based parallel processing method but also to the block-based parallel processing method or other methods. Also, both of the check node-based parallel processing method and block-based parallel processing method belong to a so-called sequential method. However, embodiments to be described below are also applicable to a simultaneous method. Note that the simultaneous method indicates an error correction decoding method which simultaneously execute row processing and column processing for the entire parity check matrix. On the other hand, the sequential method indicates an error correction decoding method which sequentially executes row processing and column processing for each predetermined unit (for example, a block, check node, or the like) of the parity check matrix.

First Embodiment

As exemplified in FIG. 1, an error correction decoder according to the first embodiment includes an LLR conversion table 110, LLR memory (LMEM) 120, calculation circuit 130, and parity check circuit 140. The error correction decoder shown in FIG. 1 generates error correction data by correction errors included in read data from a NAND memory (NRAM) 100. The error correction data is written in a data memory (DMEM) 150, and is then written in a host memory (HRAM) 160.

The NRAM 100 stores ECC frame data encoded by an error correction encoder (not shown). NAND read data includes not only hard decision results for a plurality of bits which form the ECC frame but also soft decision results for these plurality of bits.

The LLR conversion table 110 converts NAND read data from the NRAM 100 into reliability information (for example, an LLR value). A correspondence relationship between the NAND read data and reliability information is generated in advance by, for example, a statistical method. The reliability information includes first reliability information (for example, LLR sign information) corresponding to a hard decision result of each of a plurality of bits which form the ECC frame, and second reliability information (for example, LLR absolute value information) corresponding to a soft decision result of each of these plurality of bits. In the following description, assume that the reliability information is related to an LLR value. An LLR value converted by the LLR conversion table 110 is written in the LMEM 120.

The LMEM 120 stores LLR values from the LLR conversion table 110. The LLR values stored in the LMEM 120 are read out for row processing and column processing executed by the calculation circuit 130. The calculation circuit 130 updates the readout LLR values through the row processing and column processing, and writes back updated LLR values in the LMEM 120.

Note that the LMEM 120 requires a storage capacity of a code length×the number of quantization bits of an LLR value or more. Hence, in terms of cost optimization, some LLR storage areas may be implemented using a static RAM (SRAM). However, at least a storage area of the first reliability information (for example, LLR sign information) is implemented by a register which is configured to allow the parity check circuit 140 to steadily read out that storage area. A path between the LMEM 120 and parity check circuit 140 may be arranged independently of that between the LMEM 120 and DMEM 150 (that is, a path on which the first reliability information is output when parity check results of all check nodes are OK).

The calculation circuit 130 reads out the first reliability information and second reliability information from the LMEM 120, and executes row processing and column processing using the first reliability information and second reliability information. The calculation circuit 130 writes back the first reliability information and second reliability information updated through the column processing in the LMEM 120.

The parity check circuit 140 reads out first reliability information for each of a plurality of bits which form an ECC frame, and executes parity checking of a temporary estimated word based on that information for all check nodes. More specifically, the parity check circuit 140 executes parity checking once or more before completion of the entire row processing and the entire column processing for the parity check matrix by the calculation circuit 130 for each trial of iterative decoding. Note that the iterative decoding means to iteratively try a series of processes including row processing and column processing of the entire parity check matrix, generation of a temporary estimated word, and parity checking of a temporary estimated word for all check nodes.

For example, if the error correction decoder shown in FIG. 1 operates based on a sequential method, the parity check circuit 140 may execute parity checking every time row processing and column processing for the predetermined number of check nodes are complete. Alternatively, if the error correction decoder shown in FIG. 1 operates based on a simultaneous method, the parity check circuit 140 may execute parity checking every time column processing (that is, LLR update processing) for the predetermined number of variable nodes is complete.

When parity check results for all check nodes are OK, iterative decoding ends, and error correction data is written in the DMEM 150 and is then written in the HRAM 160. On the other hand, when a parity check result for at least one check node is NG, iterative decoding continues. Note that the parity check circuit 140 can steadily read out the first reliability information from the LMEM 120.

In general, in the conventional iterative decoding, after completion of the entire row processing and the entire column processing for the parity check matrix, parity checking of a temporary estimated word is executed based on LLR values of the parity check matrix. Hence, all errors have been corrected in the middle of iterative decoding (that is, at the end timing of column processing for some variable nodes), the residual processing has to be continued.

Figure 15:
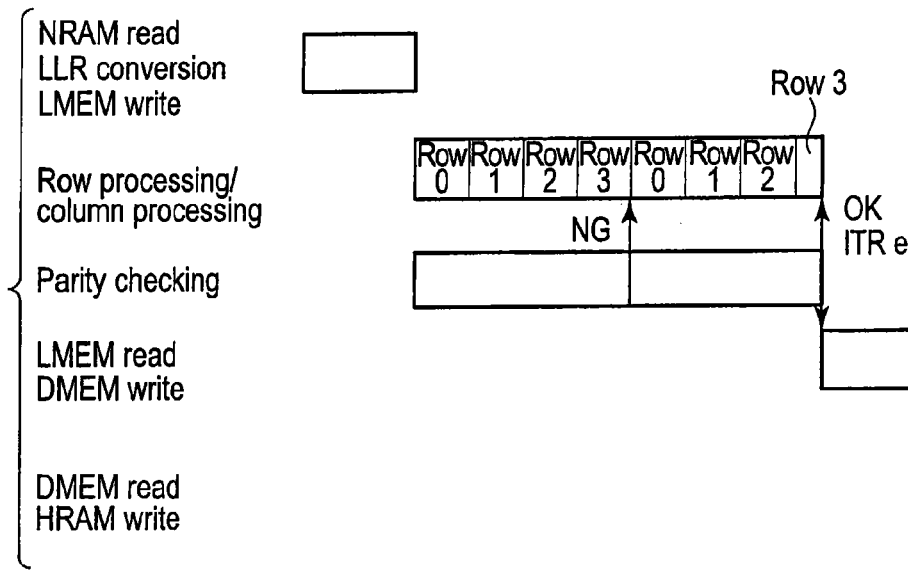
FIG. 15 is a view showing an example of the operation of the error correction decoder shown in FIG. 1.

On the other hand, the parity check circuit 140 executes parity checking once or more before completion of the entire row processing and the entire column processing for the parity check matrix by the calculation circuit 130 for each trial of iterative decoding. Then, if all errors have been corrected in the parity checking inserted in the middle of the iterative decoding, the iterative decoding can end without executing the residual processing, as exemplified in FIG. 15.

Therefore, according to the parity check circuit 140, since a processing delay and power consumption by execution of the residual processing can be reduced, shortening of a decoding time and a power consumption reduction can be expected. However, strictly speaking, an extra processing delay and power consumption are required due to insertion of parity checking. However, according to a normal design, the power consumption of parity checking by the party check circuit 140 is sufficiently smaller than that of processing (row processing and/or column processing) of a predetermined unit by the calculation circuit 130. Also, as will be described below, parity checking can be executed in short clock cycles.

In order to suppress a processing delay due to insertion of parity checking, the parity check circuit 140 preferably executes parity checking in short clock cycles. For example, clock cycles required for parity checking are designed to be 10% or less of those required for processing of a predetermined unit of the calculation circuit 130. The processing of the predetermined unit of the calculation circuit 130 may include, for example, row processing and column processing for the predetermined number of check nodes in case of the sequential method, or column processing for the predetermined number of variable nodes in case of the simultaneous method.

Figure 16:
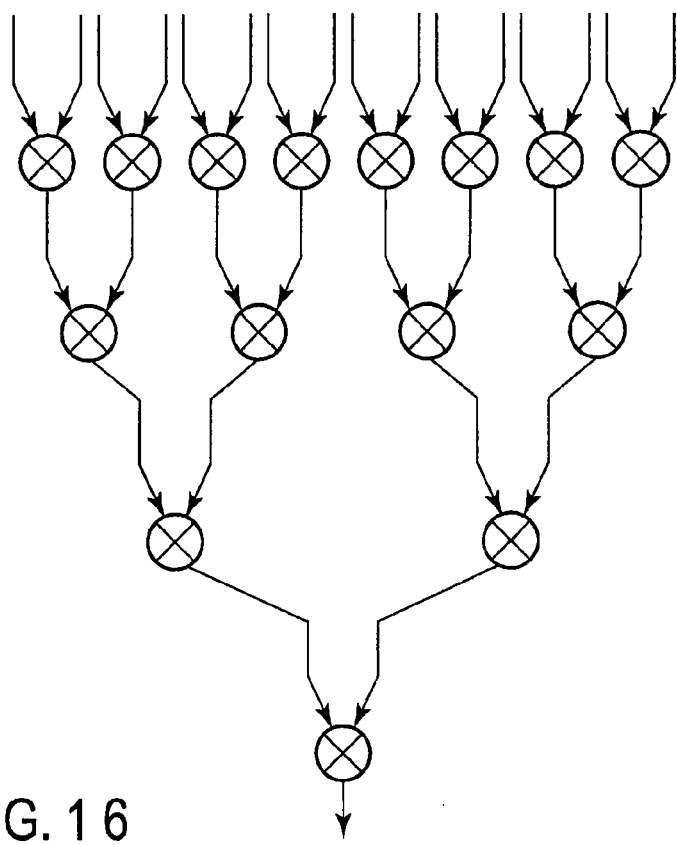
FIG. 16 is a view showing an example of a unit circuit included in a parity check circuit shown in FIG. 1.

The parity check circuit 140 may parallelly execute parity checking for a plurality of check nodes so as to attain parity checking in short clock cycles. In order to parallelly execute parity checking for a plurality of check nodes, a plurality of unit circuits, each of which is used to execute parity checking for a single check node, may be connected in parallel. FIG. 16 shows an example of such unit circuit.

The unit circuit shown in FIG. 16 includes a plurality of half adders (EX-OR circuits) which are connected in a binary tree pattern. The total number of half adders is equal to (row weight-1). Each half adder arranged at an end inputs pieces of first reliability information (for example, LLR sign bits) for two out of a plurality of variable nodes corresponding to a check node to be processed. The half adder calculates an EX-OR of the input pieces of first reliability information, and outputs a calculation result to a half adder of the next stage. Finally, a half adder arranged at a root can output a bit indicating a parity check result of the check node to be processed.

According to the unit circuit shown in FIG. 16, parity checking for a single check node can be executed in one clock cycle. Therefore, when a plurality of such unit circuits as many as the number of rows of the parity check matrix are connected in parallel, the parity check circuit 140 can execute parity checking in one clock cycle. Alternatively, when a plurality of such unit circuits as many as half the number of rows of the parity check matrix are connected in parallel, the parity check circuit 140 can execute parity checking in 2 (=1×2) clock cycles.

As described above, the LLR memory of the error correction decoder according to the first embodiment includes the register which is configured to allow the parity check circuit to steadily read out first reliability information corresponding to a hard decision result of each of a plurality of bits which form an ECC frame defined by the parity check matrix. The parity check circuit of this error correction decoder executes parity checking once or more before completion of the entire row processing and the entire column processing for the parity check matrix by the calculation circuit for each trial of iterative decoding. That is, this error correction decoder can end iterative decoding without executing any residual processing by inserting parity checking in the middle of iterative decoding if all errors are corrected by the parity checking. Therefore, according to this error correction decoder, a decoding time can be shortened, and power consumption can be reduced.

At least some of processes of the above embodiment can be implemented using a general-purpose computer as basic hardware. Programs which implement the processing of the embodiment may be provided while being stored in a computer-readable storage medium. The programs are stored in the storage medium as a file of an installable format or in an executable format. As the storage medium, a magnetic disk, optical disk (CD-ROM, CD-R, DVD, etc.), magneto-optical disk (MO), semiconductor memory, and the like may be used. The storage medium is not particularly limited as long as it can store programs and is readable by a computer. The programs which implement the processing of the embodiment may be stored on a computer (server) connected to a network such as the Internet, and may be downloaded to a computer (client) via the network.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. An error correction decoder comprising:
a storage unit configured to store first reliability information corresponding to a hard decision result of each of a plurality of bits which form an ECC (Error Correction Code) frame defined by a parity check matrix, and second reliability information corresponding to a soft decision result of each of the plurality of bits;
a calculation circuit configured to execute row processing and column processing using the first reliability information and the second reliability information; and
a parity check circuit configured to execute parity checking of a temporary estimated word based on the first reliability information using the parity check matrix, and wherein
the storage unit includes a register configured to allow the parity check circuit to steadily read out at least the first reliability information, and
the parity check circuit executes the parity checking at least once before completion of entire row processing and entire column processing for the parity check matrix by the calculation circuit for each trial of iterative decoding, the trial of the iterative decoding including the entire row processing and the entire column processing for the parity check matrix.

2. The decoder according to claim 1, wherein the parity check circuit includes a plurality of unit circuits which are connected in parallel, and
each of the plurality of unit circuits executes parity checking for each row of the parity check matrix.

3. The decoder according to claim 2, wherein the total number of the plurality of unit circuits is equal to the number of rows of the parity check matrix.

4. The decoder according to claim 1, wherein the decoder operates based on a sequential method, and
the parity check circuit executes the parity checking every time completion of row processing and column processing for the predetermined number of check nodes of the parity check matrix by the calculation circuit.

5. The decoder according to claim 4, wherein clock cycles required for the parity checking are not more than 10% of clock cycles required for row processing and column processing for the predetermined number of check nodes.

6. The decoder according to claim 1, wherein the decoder operates based on a simultaneous method, and
the parity check circuit executes the parity checking every time completion of column processing for the predetermined number of variable nodes of the parity check matrix by the calculation circuit.

7. The decoder according to claim 6, wherein clock cycles required for the parity checking are not more than 10% of clock cycles required for column processing for the predetermined number of variable nodes.

8. The decoder according to claim 1, wherein a path between the storage unit and the parity check circuit is arranged independently of a path required to output the first reliability information from the storage unit when parity check results for all check nodes of the parity check matrix are OK.

9. An error correction decoding method comprising:
controlling a storage unit to store first reliability information corresponding to a hard decision result of each of a plurality of bits which form an ECC (Error Correction Code) frame defined by a parity check matrix, and second reliability information corresponding to a soft decision result of each of the plurality of bits;
controlling a calculation circuit to execute row processing and column processing using the first reliability information and the second reliability information; and
controlling a parity check circuit to execute parity checking of a temporary estimated word based on the first reliability information using the parity check matrix, and wherein
the storage unit includes a register configured to allow the parity check circuit to steadily read out at least the first reliability information, and
the parity check circuit executes the parity checking at least once before completion of entire row processing and entire column processing for the parity check matrix by the calculation circuit for each trial of iterative decoding, the trial of the iterative decoding including the entire row processing and the entire column processing for the parity check matrix.

10. The method according to claim 9, wherein the parity check circuit includes a plurality of unit circuits which are connected in parallel, and the method further comprises controlling each of the plurality of unit circuits to execute parity checking for each row of the parity check matrix.

11. The method according to claim 10, wherein the total number of the plurality of unit circuits is equal to the number of rows of the parity check matrix.

12. The method according to claim 9, wherein the method is based on a sequential method, and further comprises controlling the parity check circuit to execute the parity checking every time completion of row processing and column processing for the predetermined number of check nodes of the parity check matrix by the calculation circuit.

13. The method according to claim 12, wherein clock cycles required for the parity checking are not more than 10% of clock cycles required for row processing and column processing for the predetermined number of check nodes.

14. The method according to claim 9, wherein the method is based on a simultaneous method, and further comprises controlling the parity check circuit to execute the parity checking every time completion of column processing for the predetermined number of variable nodes of the parity check matrix by the calculation circuit.

15. The method according to claim 14, wherein clock cycles required for the parity checking are not more than 10% of clock cycles required for column processing for the predetermined number of variable nodes.

16. The method according to claim 9, wherein a path between the storage unit and the parity check circuit is arranged independently of a path required to output the first reliability information from the storage unit when parity check results for all check nodes of the parity check matrix are OK.

* * * * *